United States Patent [19]
Yumoto

[11] Patent Number: 5,414,774
[45] Date of Patent: May 9, 1995

[54] CIRCUIT AND METHOD FOR CONTROLLING AN AUDIO SYSTEM

[75] Inventor: Hideki Yumoto, Streamwood, Ill.

[73] Assignee: Matsushita Electric Corporation of America, Secaucus, N.J.

[21] Appl. No.: 17,244

[22] Filed: Feb. 12, 1993

[51] Int. Cl.⁶ .............................................. H03G 3/00
[52] U.S. Cl. .......................................... 381/1; 381/28; 381/63; 381/24
[58] Field of Search ................... 381/63, 12, 1, 28, 24

[56] References Cited

U.S. PATENT DOCUMENTS

| | | | |
|---|---|---|---|
| 4,455,673 | 6/1984 | Topping et al. | 381/12 |
| 4,694,497 | 9/1987 | Kasai et al. | 381/63 |
| 4,703,501 | 10/1987 | Sugai et al. | 381/11 |
| 5,155,770 | 10/1992 | Maejima | 381/11 |

Primary Examiner—Forester W. Isen
Attorney, Agent, or Firm—Willian Brinks Hofer Gilson & Lione

[57] ABSTRACT

A circuit for directly differentiating stereo and mono signals regardless of whether a pilot carrier signal is present. The circuit generally includes a detection circuit coupled to a control circuit. The detection circuit subtracts the left and right audio signals, and the control circuit compares the resulting difference to a reference signal. When the reference signal exceeds the difference between the left and right signals, the control circuit judges that the inputs are mono. The circuit is advantageously used to automatically disable a repercussion function of a stereo system when a mono signal is received.

19 Claims, 8 Drawing Sheets

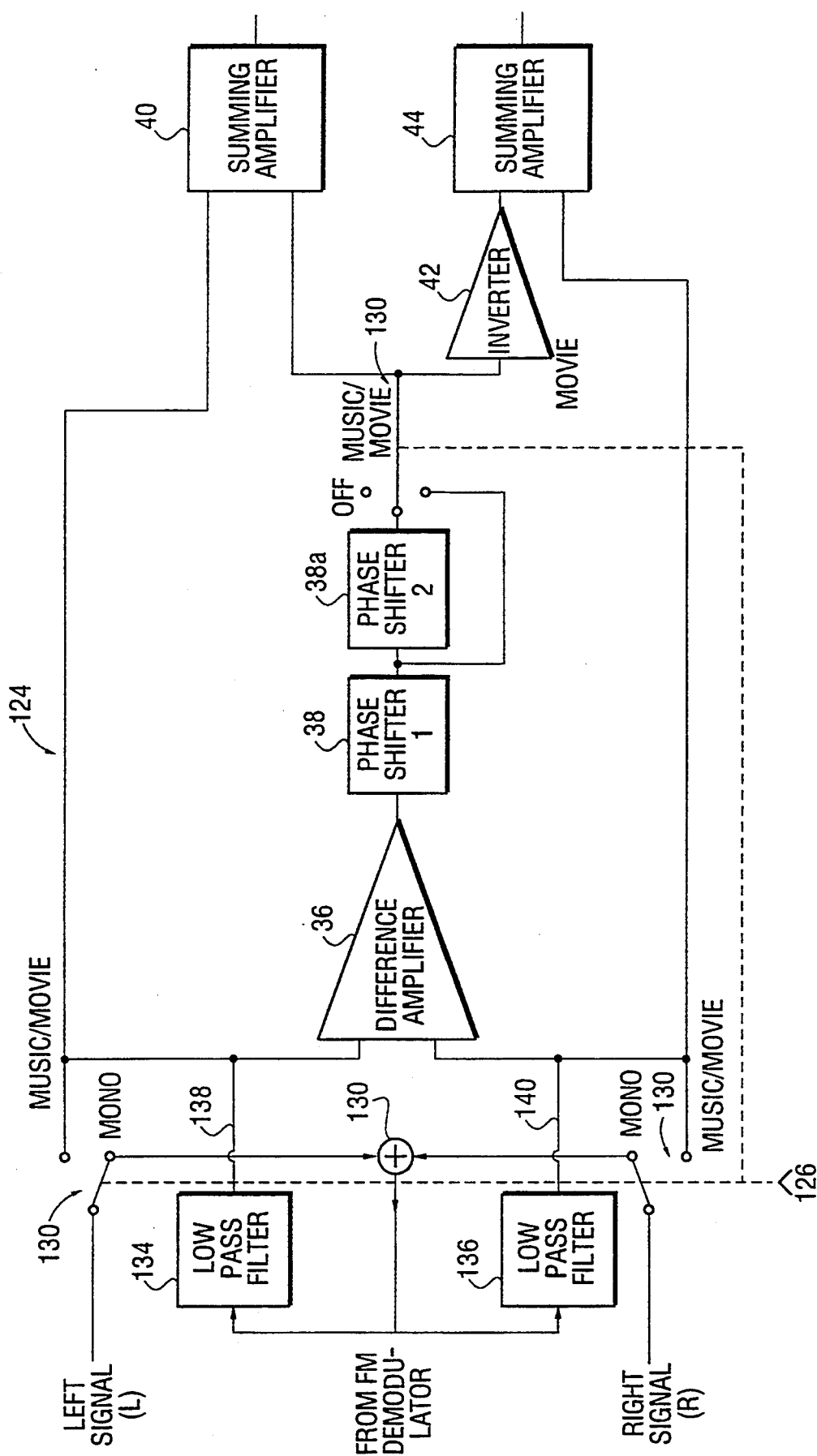

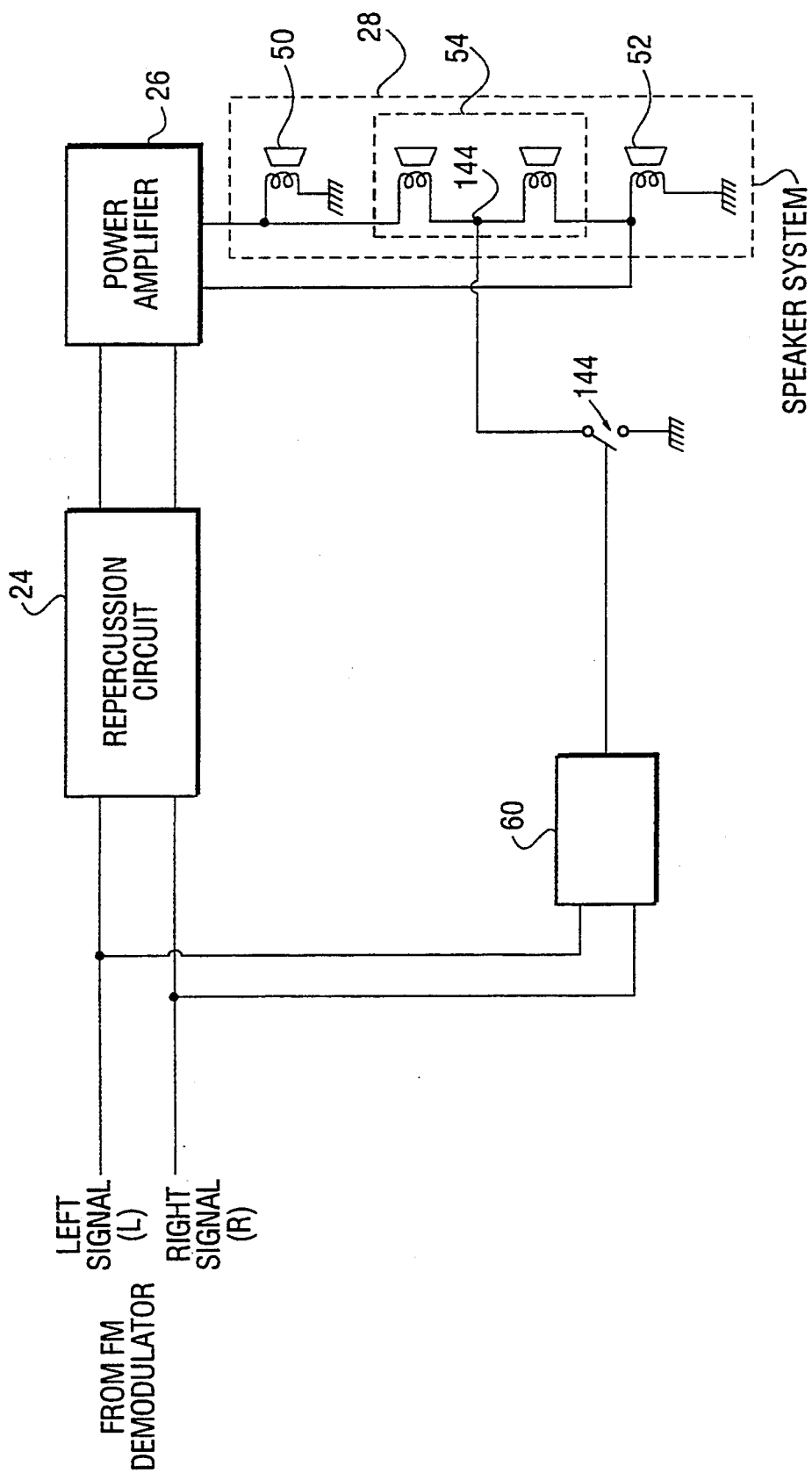

CIRCUIT AND METHOD FOR CONTROLLING AN AUDIO SYSTEM

FIELD OF THE INVENTION

This invention relates in general to stereo audio systems. More particularly, it relates to a circuit and method for automatically controlling a stereo audio system under predetermined conditions.

BACKGROUND OF THE INVENTION

Sound-reproducing audio systems are used to pick up sound at one location and reproduce it at the same or some other location. Audio systems may be generally classified as monaural, binaural, stereophonic, or quadraphonic. The most commonly used systems are monaural and stereophonic.

Monaural ("mono") audio systems transmit sound signals on a single transducing channel connected to one or more speakers and/or earphones. The most common example is the telephone, which generally has one microphone, one transducer and one earphone.

Stereophonic ("stereo") audio systems are field-type systems in which two or more microphones are used to pick up the original sound. Each microphone is coupled to one of at least two independent transducing channels (L and R) which are themselves coupled to at least two loudspeakers. In the ideal configuration, the loudspeakers are arranged in the same general position as the microphones. The stereo transducer may be an amplifier, a radio transmitter, a radio receiver, a phonograph, a sound motion picture unit, a television transmitter and/or receiver, or a magnetic tape recorder and reproducer.

Repercussion audio systems (also known as "Surround-Sound") have been developed by the assignee of the present invention for creating realistic sounds in a conventional stereo system. For example, in a live setting such as a concert hall or a theater, listeners receive direct sounds and repercussion sounds. The direct sounds emanate from the original sound source and/or the loudspeakers, and the repercussion sounds are direct sounds that reflect off walls or other objects in the hall to the listener. Repercussion audio systems provide, in addition to the left and right stereo speakers, an extra set of repercussion speakers for producing repercussion sounds. The typical repercussion system utilizes phase delays and other features to simulate the repercussion sounds a listener would hear in a concert hall or theater.

FIG. 1 illustrates a frequency-modulated stereo transmission signal. The modulated stereo signal generally includes a L+R component, a pilot carrier, a L−R component and a suppressed carrier. It is not practical to simply modulate L and R separately because the transmitted signal must be decipherable by either a stereo or mono receiver. If L and R were modulated independently, the mono receiver could receive only one channel or the other. For the mono receiver to correctly receive a stereo broadcast, some component of that broadcast must be a single signal that includes information from both the left and the right channels. This single signal is the L+R signal shown in FIG. 1. The mono receiver simply demodulates L+R and delivers it to the listener.

A stereo receiver uses the L+R signal and the L−R signal to demodulate separate L and R signals. The stereo receiver separates L and R according to the following equations:

$$(L+R)+(L-R)=2L \qquad *1*$$

$$(L+R)-(L-R)=2R \qquad *2*$$

As shown in FIG. 1, stereo broadcasts also includes a pilot carrier signal (15.75 kHz) which indicate to the receiver that the broadcast is in stereo. However, in applications such as radio and television broadcasts, the pilot carrier may accompany both mono and stereo signals. For example, commercials are typically broadcast in mono even though the actual program is in stereo. However, broadcasters typically do not bother to turn off the pilot carrier signal during commercials, and thus, the stereo receiver produces identical signals (L+R) at each stereo speaker.

FIG. 2 illustrates an example of a stereo system 20 used in connection with a television receiver (not shown). For the example shown in FIG. 2, the stereo system 20 includes an FM demodulator 22, a repercussion circuit 24, a power amplifier 26, a speaker system 28, and a microprocessor 30. The FM demodulator 22 receives signals from an intermediate-frequency amplifier (not shown) and outputs left (L) and right (R) audio signals to the repercussion circuit 24. A pilot carrier signal (shown in FIG. 1) is transmitted with stereo broadcasts in order to notify the FM demodulator 22 that the incoming signals are stereo. If the pilot carrier is not present, the FM demodulator 22 assumes that the incoming signals are mono. The FM demodulator 22 informs the microprocessor 30 of whether the incoming signal is mono or stereo, and the microprocessor 30 chooses the appropriate mode of operation (stereo or mono). The microprocessor 30 also allows the user to chose various configurations for the television's audio system such as stereo, mono or repercussion modes. An example of a television with a repercussion mode and microprocessor control is the model CTP-3180 by Matsushita Electronics Corp. of America.

FIG. 3 is a more detailed diagram of the repercussion circuit 24 shown in FIG. 2. Amplifiers 32 and 34 amplify the incoming L and R signals from the FM demodulator 22 (shown in FIG. 2), and a difference amplifier 36 produces an output signal (L−R) proportional to the difference between the incoming L and R signals. The output from the difference amplifier 36 is fed to a phase shift network 38 in order to generate a phase shifted signal $\phi(L-R)$. The signal $\phi(L-R)$ is added to L by a summing amplifier 26 to produce $L+\phi(L-R)$. The signal $\phi(L-R)$ is inverted by a phase invertor 42 and also added to R by a summing amplifier 44 to produce $R-\phi(L-R)$. The power amplifier 26 amplifies the outputs from the summing amplifiers 40, 44 to produce $A(L+\phi(L-R))$ for the left channel 46 and $A(R-\phi(L-R))$ for the right channel 48. The $\phi(L-R)$ component represents the simulated repercussion sounds heard in concert halls. The speaker system 28 includes a left stereo speaker 50, a right stereo speaker 52 and repercussion speakers 54. The left channel 46 is connected to the positive (+) input of the left speaker 50, and the right channel 48 is connected to the positive (+) input of the right speaker 52. The Repercussion speakers 54 are connected in series across the positive inputs of the stereo speakers 50, 52.

The repercussion speakers 54 are driven by the potential difference from the positive input of the left stereo speaker 50 to the positive input of the right stereo speaker 52. This potential is calculated as follows:

$$A(L+\phi(L-R))-A(R-\phi(L-R))=A(L-R)+2A\phi(L-R) \quad *3*$$

The repercussion speakers 54 are connected in series and have substantially the same resistance, and thus the total potential drop across both speakers 54 is divided equally across each of the speakers 54. Accordingly, the voltage potential Vp for driving each repercussion speaker 54 is as follows:

$$Vp = \tfrac{1}{2}A(L-R)+A\phi(L-R) \quad *4*$$

As shown by equation *4* above, the voltage drop across the repercussion speakers 54 should be zero when L and R are identical. However, L and R always have some amplitude and phase differences due to uneven transmission characteristics in the left and right channels 46, 48. Thus, when a mono signal is received by a repercussion stereo, noises may be generated in correspondence with the random amplitude and phase differences between the left and right channels.

Thus, there is a need for a stereo system in which stereo signals are detected directly regardless of whether a pilot carrier signal is present. There is a further need for a repercussion stereo system that avoids the noises that may be generated when a repercussion stereo receives a mono signal. To date, no circuit or method has been provided for addressing these and other associated needs.

SUMMARY OF THE INVENTION

Thus, it is an object of the present invention to improve the performance of stereo audio systems.

It is another object of the present invention to improve the performance of repercussion stereo audio systems.

It is another object of the present invention to directly differentiate between stereo and mono audio inputs.

It is another object of the present invention to reduce the potential for noise outputs from repercussion stereo audio systems.

It is also an object of the present invention to automatically disable a repercussion circuit when a mono input is received.

These and other objects are achieved in accordance with the present invention by providing a circuit in electronic communication with a stereo system. The circuit generally includes a detection circuit in electronic communication with a control circuit which is in electronic communication with the stereo. The detection circuit is capable of intercepting the L and R audio inputs to the stereo. The detection circuit subtracts L and R and produces a difference output. The control circuit accepts the difference output and acts on the stereo when a reference signal exceeds the difference output.

For the disclosed embodiments, the above-described detection circuit includes a difference amplifier in electronic communication with a rectifier. The difference amplifier receives the L and R signals and generates an analog output corresponding to the difference between L and R. The rectifier converts this analog output to a DC difference output.

The above-described control circuit includes a comparator in electronic communication with a switching circuit. The comparator produces a comparison output when the reference signal exceeds the difference output, and the switching circuit controls the stereo system in response to the comparison output.

Thus, the present invention achieves several advantages. For example, the disclosed circuit directly distinguishes mono signals from stereo signals without the need for detecting a pilot carrier signal. This allows the circuit to automatically control various aspects of the stereo system based on the direct detection of stereo signals. In the disclosed embodiments, the circuit is used to automatically disable a repercussion portion of a stereo system when a mono signal is received, thus avoiding the noise that may be generated by a repercussion system when it receives a mono signal. Thus, the invention finds particular use in connection with stereo broadcasts in which the pilot carrier may be present for mono portions of the broadcast.

BRIEF DESCRIPTION OF THE DRAWINGS

FIG. 9 is a diagram illustrating a preferred method of coupling the circuit shown in FIGS. 4 and 5 to a stereo audio system having a "mono repercussion" mode; and FIG. 10 is a diagram illustrating another preferred method of coupling the circuit shown in FIGS. 4 and 5 to the stereo audio system shown in FIGS. 2 and 3.

DETAILED DESCRIPTION OF THE PRESENTLY PREFERRED EMBODIMENTS

Figure 2:
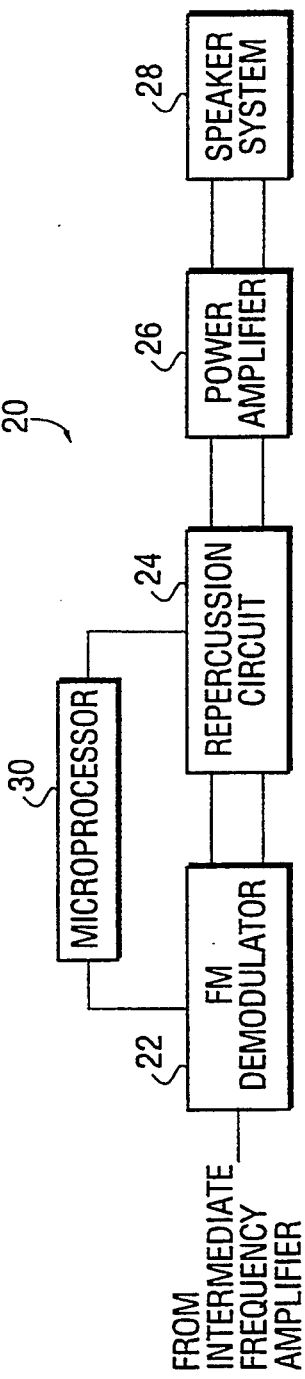
FIG. 2 is a block diagram illustrating a stereo audio system of a television.
Figure 4:
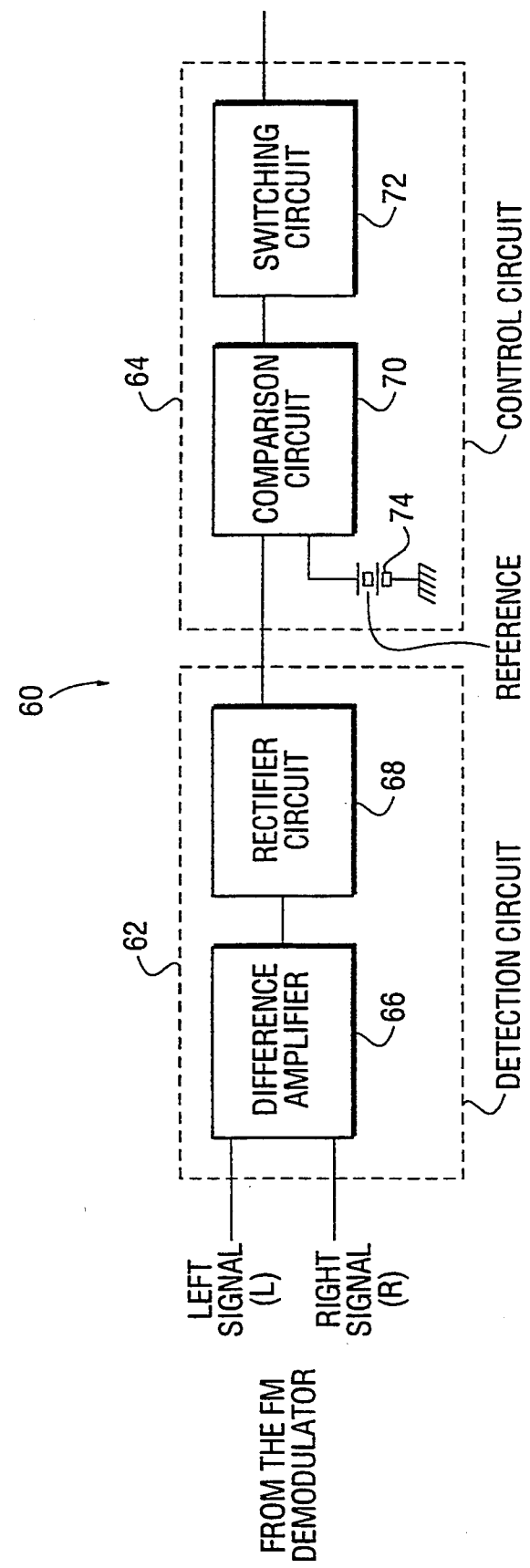
FIG. 4 is a block diagram of a preferred embodiment of a circuit for directly detecting stereo signals.
Figure 5:
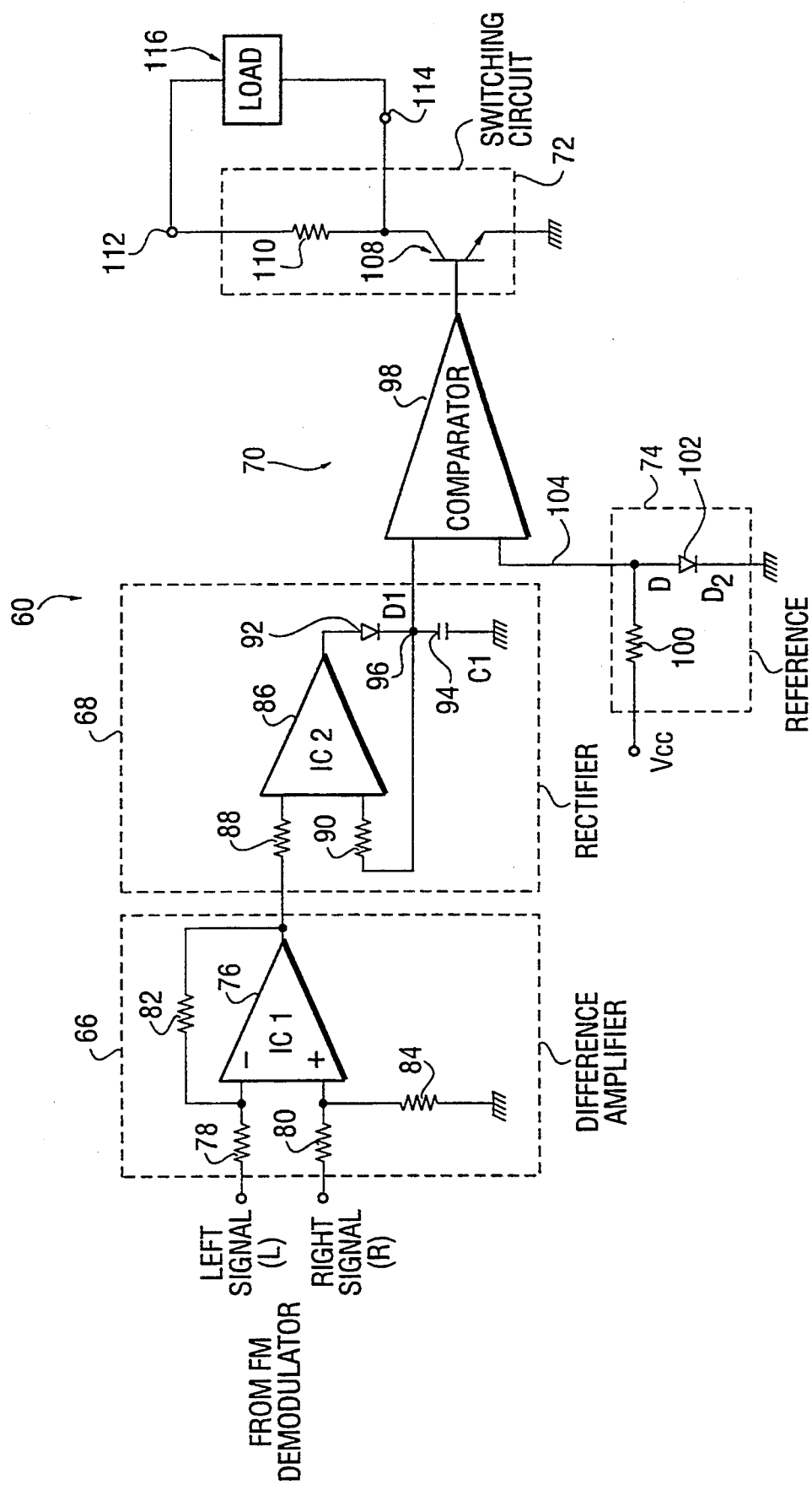
FIG. 5 is a more detailed diagram of the circuit shown in FIG. 4.

Turning now to the drawings, FIGS. 4 and 5 illustrate a circuit 60 embodying the features of the present invention. As best seen in FIG. 4, the circuit 60 generally includes a detection circuit 62 coupled to a control circuit 64. The detection circuit 62 accepts the left (L) and right (R) signals from an FM demodulator (22 shown in FIG. 2), and the control circuit 64 is in electronic communication with a stereo audio system 20.

The present invention directly detects the presence of a stereo signal regardless of whether a pilot carrier signal is present. As shown in FIGS. 4 and 5, this is accomplished in the disclosed embodiment by including a difference amplifier 66 and a rectifier 68 as part of the detection circuit 62, and further including a comparison circuit 70 and a switching circuit 72 as part of the control circuit 64. The difference amplifier 66 directly senses the L and R audio signals and generates a difference output representing L−R. The rectifier 68 converts the L−R difference output to a DC signal, and the comparison circuit 70 compares the DC difference output to a reference voltage 74.

There are significant differences between the left and right channel components of a stereo signal. However, for a mono signal, the difference between the left and right channels is due primarily to the amplitude and phase differences between the channels, and these differences are relatively small in comparison to stereo signals. By setting a sufficiently small value for the reference voltage 74, the comparison circuit 70 can indicate when the reference voltage 74 exceeds the L−R. The comparison circuit 70 output is coupled to the switching circuit 72 which is coupled to the stereo audio system 20. The comparison circuit 70 activates the switching circuit 72 when the reference voltage 74 exceeds the DC difference output.

Figure 3:
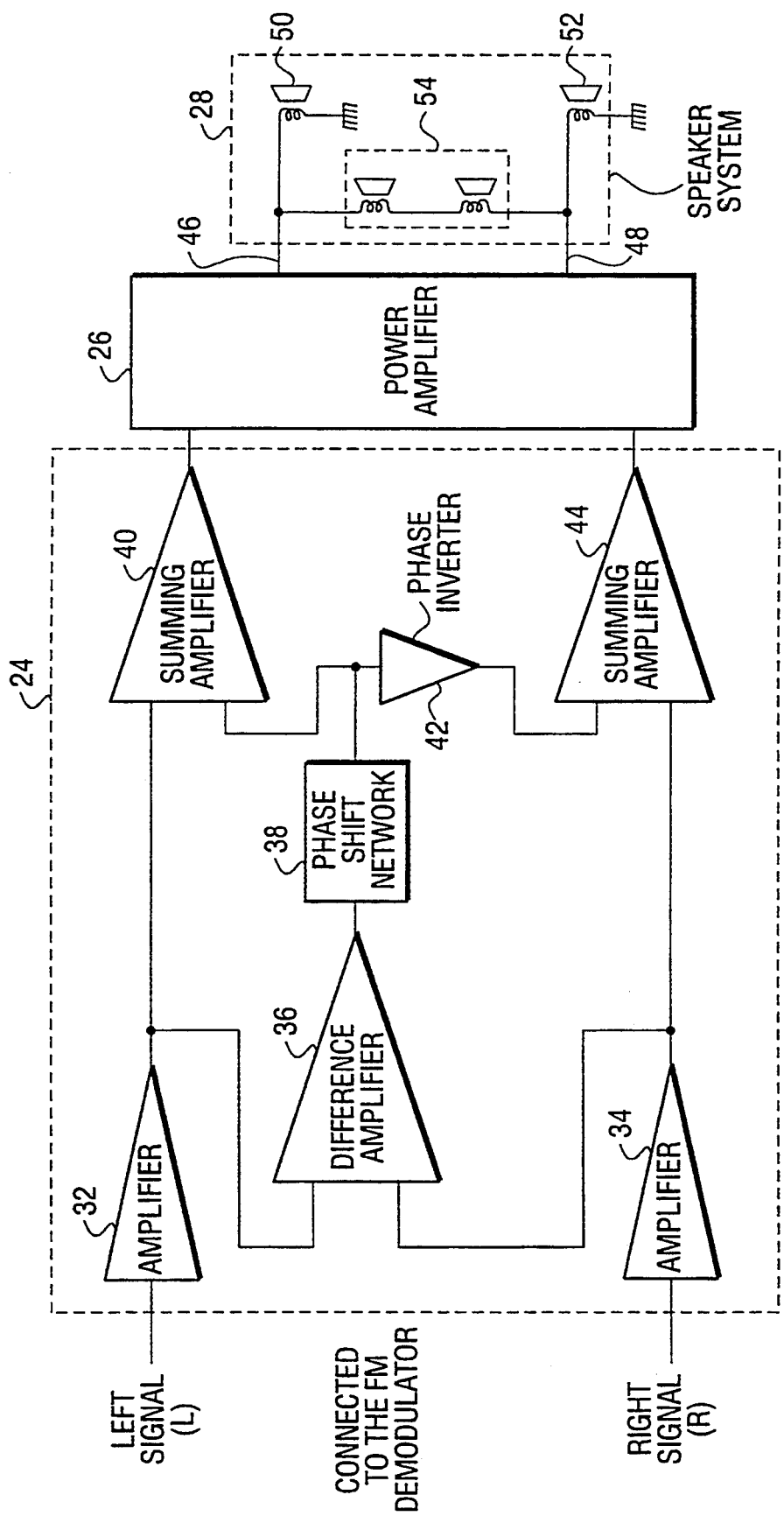
FIG. 3 is a more detailed diagram of the repercussion circuit of the stereo audio system shown in FIG. 1.

The circuit 60 can be used in a variety of ways to provide control based on the direct detection of stereo signals. In particular, the circuit 60 may be used in connection with a stereo system 20 having the general features illustrated in FIGS. 2 and 3. The output of the circuit 60 may be electronically coupled to the stereo 20 in order to automatically disable the repercussion circuit 24 whenever the circuit 60 judges that a mono signal is being received.

Figure 6:
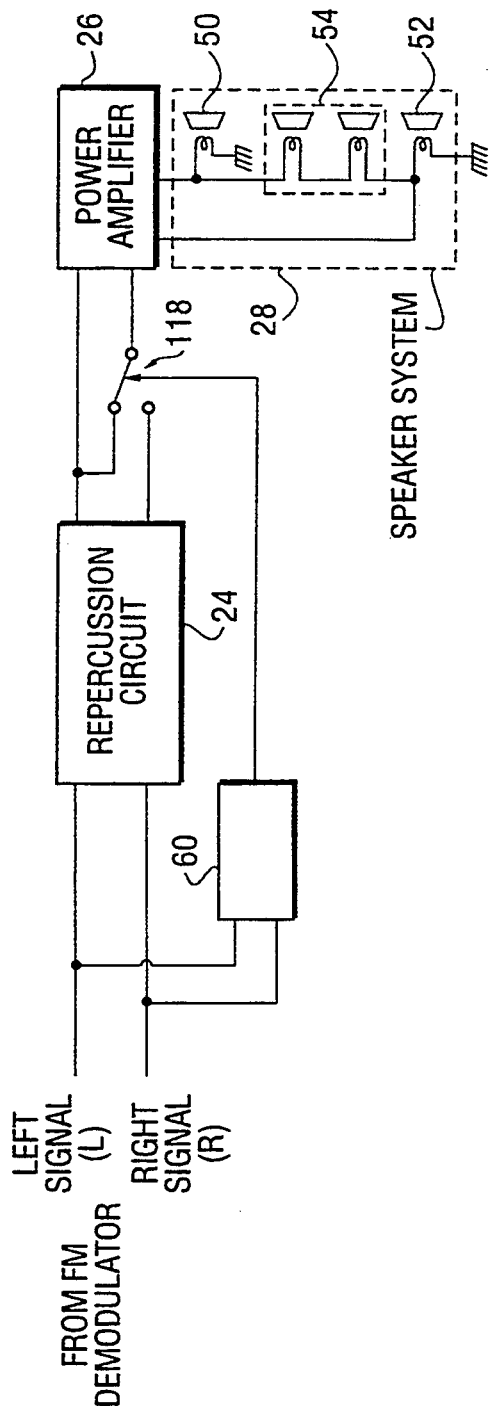
FIG. 6 is a block diagram illustrating a preferred method of coupling the circuit shown in FIGS. 4 and 5 to the stereo audio system shown in FIGS. 2 and 3.
Figure 7:
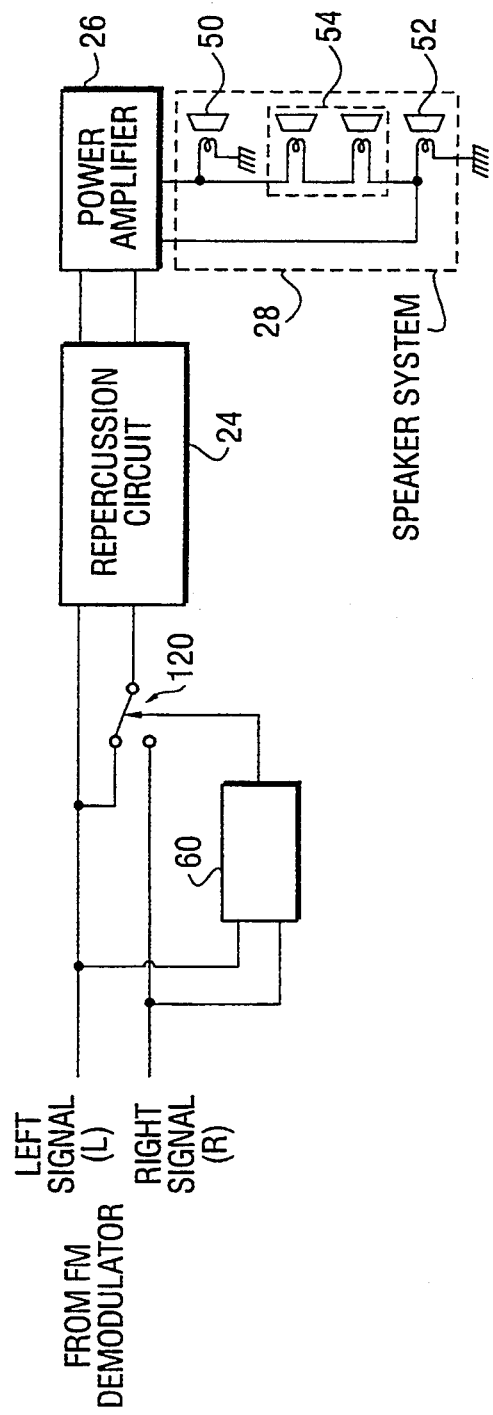
FIG. 7 is a block diagram illustrating another preferred method of coupling the circuit shown in FIGS. 4 and 5 to the stereo audio system shown in FIGS. 2 and 3.
Figure 8:
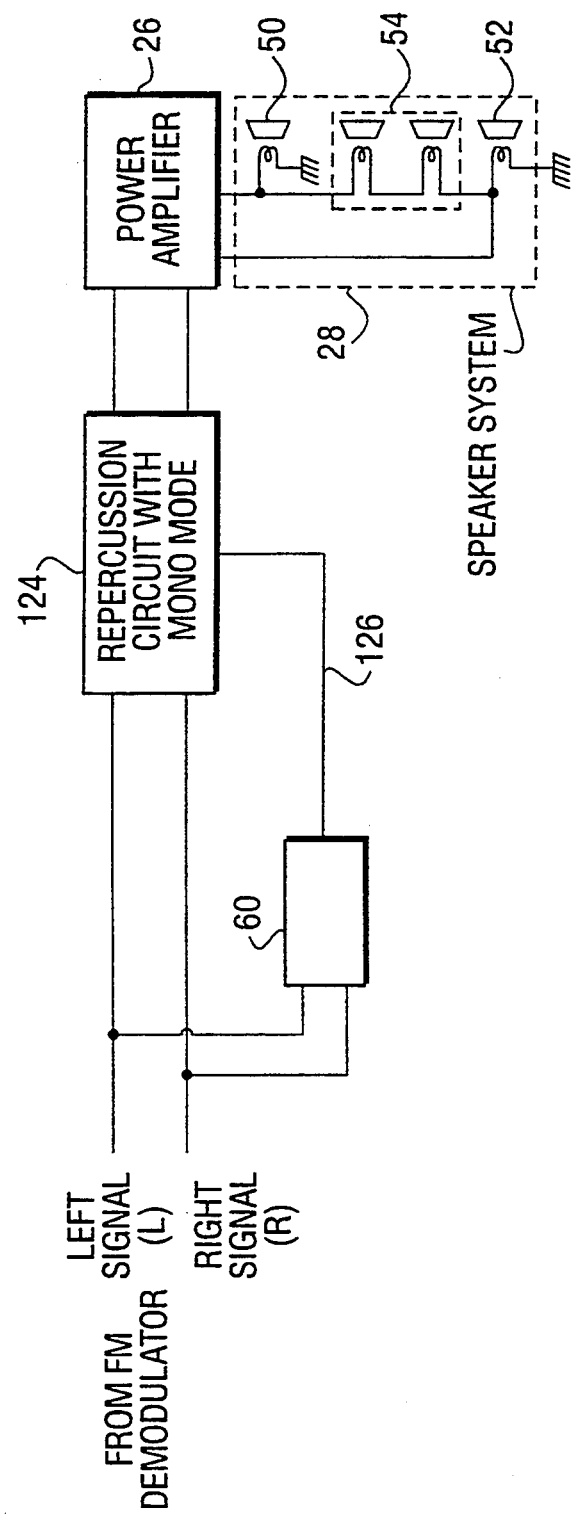
FIG. 8 is a block diagram illustrating another preferred method of coupling the circuit shown in FIGS. 4 and 5 to the stereo audio system shown in FIGS. 2 and 3.

The circuit 60 can disable the repercussion circuit 24 in variety of ways as shown in FIGS. 6-10. FIG. 6 illustrates the circuit 60 output coupled downstream of the repercussion circuit 24. FIG. 7 illustrates the circuit 60 output coupled upstream of the repercussion circuit 24. FIG. 8 illustrates the circuit 60 output coupled directly to the repercussion circuit 24 for switching the repercussion circuit 24 to a mono mode. FIG. 10 illustrates the circuit 60 output coupled to the repercussion speakers 54 for disabling the repercussion speakers 54.

Turning now to FIG. 5, a more detailed example of the circuit 60 will now be described. FIG. 5 illustrates a schematic diagram of a preferred embodiment of the circuit 60 used to disable the repercussion circuit 24 of the stereo system 20 shown in FIGS. 2 and 3. The difference amplifier 66 generally includes an operational amplifier 76 coupled to several resistors 78, 80, 82 and 84. One resistor 80 is connected between the noninverting input (+) of the operational amplifier 76 and the R signal from the FM demodulator 22 (shown in FIG. 2). Another resistor 84 is connected between ground and the noninverting input (+) of the operational amplifier 76. Another resistor 78 is connected between the inverting input of the operational amplifier 76 and the L signal from the FM demodulator 22 (shown in FIG. 2). A final resistor 82 is connected in a feedback loop between the output from the operational amplifier 76 and the inverting input of the operational amplifier 76.

The rectifier circuit 68 includes an operational amplifier 86 coupled to two resistors 88 and 90 and a forward-biased diode 92. One resistor 88 is connected between the inverting input of the operational amplifier 86 and the output from the operational amplifier 76. The other resistor 90 is connected in a feedback loop between the noninverting input of the operational amplifier 86 and the output from the diode 92. A capacitor 94 is connected between ground and the point indicated at 96.

The comparison circuit 70 includes a comparator 98 coupled to the reference signal 74, the DC output from point 96, and the switching circuit 72. The DC output from point 96 is coupled to one comparator 98 input, and the reference signal 74 is coupled to the other comparator 98 input. The reference signal 74 is generated by an input voltage Vcc, a resistor 100 and a diode 102, configured as shown in FIG. 5. The reference signal 74 is the voltage at point 104 which is set by the voltage drop across the diode 102. The preferred diode 102 is a solid state diode having a small but relatively stable voltage drop. For a Silicon (Si) solid state diode, the voltage drop is 0.7 volts. For a Germanium (Ge) solid state diode, the voltage drop is 0.3 volts. Other diodes such as zener diodes are also usable.

The output from the comparator 98 is coupled to the switching circuit 72 which includes an npn transistor 108 and a resistor 110. The base of the transistor 108 is connected to the output from the comparator 98, and the emitter of the transistor 108 is connected to ground. The resistor 110 is connected between the transistor's 108 collector and a terminal 112 which is coupled to the stereo system 20.

The L and R input signals are evaluated by the circuit 60 in the following manner. The difference amplifier 66 produces an analog difference output proportional to L−R. The difference output (L−R) is rectified by an operational amplifier 86 and filtered or "smoothed" to a steady DC signal by a diode 92 and a capacitor 94. Thus, the DC difference output at point 96 represents an average difference between L and R. As noted above, stereo broadcasts have a large difference between L and R, and thus, the DC difference output for a stereo signal is relatively large in comparison with the DC difference output for a mono signal.

Figure 1:
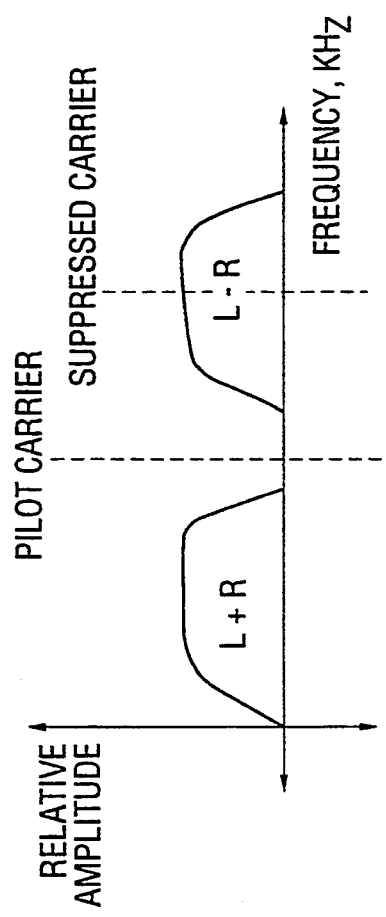
FIG. 1 illustrates the components of a stereo broadcast signal.

The DC difference output is fed to the comparator 98 and compared to the reference voltage 74 which is the voltage drop across solid state diode 102. If the DC difference output is larger than the reference signal 74, the comparator 98 judges that a stereo signal is being received. If the DC difference output is smaller than the reference voltage 74, the comparator 98 judges that a mono signal is being received and produces a comparison output. The comparator 98 operates independently of the pilot carrier (shown in FIG. 1). The comparison output turns on the transistor switch 108 to allow current to flow through the load 116 attached at the two terminals 112, 114. For the disclosed embodiments, the load 116 may be the stereo system 20 shown in FIGS. 2 and 3.

The capacitor 94 not only smooths the DC difference output, but also holds the DC difference output for a certain time constant. During a stereo broadcast there may be moments of silence, and therefore, it may not be desirable to switch the transistor 108 on immediately. Thus, the capacitor 94 reduces the potential for unnecessary switching.

Several variations of the embodiments described above are possible. For example, FIG. 6 illustrates a configuration for coupling the circuit 60 to a stereo system 20 in order to disable the repercussion circuit 24. The circuit 60 intercepts the L and R inputs to the repercussion circuit from the FM demodulator 22 (shown in FIG. 2). The L output of the repercussion circuit 24 is connected to the left input of the power amplifier 26, and the right output of the repercussion circuit 24 is connected to the right input of the power amplifier 26 through a single-pole-double-throw switch 118. The power amplifier 26 drives the speaker system 28.

When the circuit 60 shown in FIG. 6 judges that a mono signal is being received, the circuit 60 throws the switch 118 from A to B. This couples the left output from the repercussion circuit 24 to the right input of the power amplifier 26 so that L is now fed to both the left and right inputs of the power amplifier 26. Accordingly, both outputs of the power amplifier 26 are nearly identical, and thus the repercussion speakers 54 produce little sound. Alternatively, the switch 118 may be placed in the left signal path.

In another variation, FIG. 7 illustrates another preferred configuration for coupling the circuit 60 to the stereo system 20 in order to disable the repercussion circuit 24. The circuit 60 intercepts the L and R inputs to the repercussion circuit from the FM demodulator 22 (shown in FIG. 2). The R signal feeds to the repercussion circuit 24 through a single-pole-double-throw switch 120.

When the circuit 60 shown in FIG. 7 judges that a mono signal is being received, the circuit 60 throws the switch 120 from A to B. This couples the right input of the repercussion circuit 24 to the L signal so that L is now provided to both inputs of the repercussion circuit 24. Thus, the phase and amplitude differences between the left and right channels 46, 48 do not affect the performance of the repercussion circuit 24. Alternatively, the switch 120 may also be placed in the left signal path.

In yet another variation, FIG. 8 illustrates another preferred configuration for coupling the circuit 60 to a stereo system 20 for disabling the repercussion circuit 24. The circuit 60 shown in FIG. 8 accepts the L and R signals from the FM demodulator 22 (shown in FIG. 2). This configuration is particularly advantageous for use in connection with a repercussion circuit having provisions for a mono repercussion mode.

FIG. 9 illustrates a repercussion circuit 124 having a mono repercussion mode. The output from the circuit 60 shown in FIG. 8 is coupled to a repercussion circuit 124 via line 126. When the circuit 60 judges that a mono signal is being received, the circuit 60 sends a signal via line 126 to the mode switches 130 to switch the repercussion circuit 124 to its mono repercussion mode. When the mode switches 130 are in the mono mode, L and R are added together by an adder 132. The output from the adder 132 splits to a low-pass filter 134 and a high-pass filter 136. The output from the low-pass filter 134 is fed to the left signal path 138 and the output from the high-pass filter 136 is fed to the right signal path 140. These signals are processed by the repercussion circuit 124 to create a simulated stereo effect for mono signals. The rest of the signal processing for the repercussion circuit 124 is the same as the earlier-described repercussion circuit 24.

In still another variation, FIG. 10 illustrates another preferred configuration for coupling the circuit 60 to a stereo system 20 for disabling the repercussion circuit 24. The circuit 60 intercepts the L and R inputs to the repercussion circuit 24 from the FM demodulator 22 (shown in FIG. 2). The output of the circuit 60 controls an on/off switch 142 which is coupled between ground and the center point 144 of the repercussion speakers 54.

When the circuit 60 judges that a mono signal is being received, the switch 142 is closed, thereby connecting the repercussion speakers 54 to ground. This effectively connects one of the repercussion speakers 54 in parallel with the left stereo speaker 50, and another repercussion speaker 54 in parallel with the right stereo speaker 54, thus disabling the repercussion speakers 54.

Thus, it can be seen from the above description, taken in conjunction with the accompanying figures, that the present invention achieves several advantages. For example, the disclosed circuit directly distinguishes mono signals from stereo signals without the need for detecting a pilot carrier signal. This allows the circuit to automatically control various aspects of the stereo system based on the direct detection of stereo signals. In the disclosed embodiments, the circuit is used to automatically disable a repercussion portion of a stereo system when a mono signal is received, thus avoiding the noise that may be generated by a repercussion system when it receives a mono signal. Thus, the invention finds particular use in connection with stereo broadcasts in which the pilot carrier may be present for mono portions of the broadcast.

While the above-described embodiments of the invention are preferred, those skilled in this art will recognize modifications of structure, arrangement, composition and the like which do not part from the true scope of the invention. The invention is defined by the appended claims, and all devices and/or methods that come within the meaning of the claims, either literally or by equivalents, are intended to be embraced therein.

I claim:

1. A circuit for use in connection with a stereo audio system, the circuit comprising:
    a detection circuit for generating an output based on detection of a stereo signal; and
    a control circuit in electronic communication with said detection circuit and the stereo audio system for controlling, in response to said output from said detection circuit, a repercussion sound produced by a speaker system of said stereo audio system;
    said speaker system including a left speaker, a right speaker, and a least one repercussion speaker connected in series between said left and right speakers.

2. The circuit defined in claim 1 wherein:
    said stereo signal comprises L and R audio signals;
    said detection circuit output comprises a difference output representing the difference between L and R; and
    said control circuit controls the stereo audio system when a reference signal exceeds said difference output.

3. A circuit for use in connection with a repercussion circuit of a stereo audio system, the circuit comprising:
    a detection circuit capable of accepting first and second signals that are also supplied to the stereo audio system;
    said detection circuit producing an output based on detection of a stereo signal; and
    a switching circuit in electronic communication with said detection circuit and said stereo audio system for removing the effects of said first signal from said stereo audio system and supplying a second signal to said stereo audio system when said detection circuit output indicates that said stereo signal is not present.

4. The circuit defined in claim 3 wherein:
    said first and second signals comprise analog signals; and
    said detection circuit further comprises:
        a difference amplifier circuit for receiving said first and second analog signals and generating an analog output corresponding to the difference between said first and second analog signals; and
        a rectifier circuit in electronic communication with said difference amplifier for converting said analog output to said difference output, said difference output being a DC signal.

5. The invention defined in claim 3 wherein:
said detection circuit output representing the difference between said first and second signals;
said switching circuit comprising:
a comparison circuit in electronic communication with said detection circuit for comparing said detection circuit output to said reference signal;
said comparison circuit producing a comparison output when said reference signal exceeds said detection circuit output; and
a disabling circuit in electronic communication with said comparison circuit and the stereo audio system for disabling the effects of the repercussion circuit in response to said comparison output.

6. The circuit defined in claim 3 wherein:
the stereo audio system includes a left speaker, a right speaker, and at least one repercussion speaker connected in series between said left and right speakers; and
said switching circuit further comprises means for disabling said at least one repercussion speaker when a reference signal exceeds said detection circuit output.

7. A circuit for use in connection with a repercussion circuit of a stereo audio system, the circuit comprising:
a detection circuit capable of accepting first audio signals and second audio signals which are also supplied to the stereo audio system;
said detection circuit producing a difference output representing the difference between said first and second signals; and
a switching circuit for disconnecting said first signal from the repercussion circuit and coupling a second signal to the repercussion circuit in response to a reference signal exceeding said difference output.

8. A method of disabling a repercussion circuit of a stereo audio system, the steps comprising:
determining a difference between first and second input signals to the repercussion circuit;
comparing said difference to a reference signal; and
switching the stereo audio system to a monaural function when said difference exceeds said reference signal.

9. A circuit for use in connection with a repercussion circuit of a stereo audio system, the circuit comprising:
a detection circuit capable of accepting first and second signals that are also supplied to the stereo audio system;
said detection circuit producing an output based on detection of a stereo audio signal; and
a switching circuit for switching the stereo audio system to a monaural function when said detection circuit output indicates that said stereo audio signal is not present.

10. A circuit for use in connection with a repercussion circuit of a stereo audio system, the circuit comprising:
means for determining a difference between first and second signals that are supplied to the stereo audio system;
said difference means producing a difference output representing the difference between said first and second signals;
means for comparing said difference output to a reference signal;
said comparison means producing a comparison output when said reference signal exceeds said difference output; and
means for disabling the effects of said repercussion circuit comprising a switching circuit for disconnecting said first signal from the repercussion circuit and coupling a second signal to the repercussion circuit.

11. A circuit for use in connection with a repercussion circuit of a stereo audio system, the circuit comprising:
means for determining a difference between first and second signals that are supplied to the stereo audio system;
said difference means producing a difference output representing the difference between said first and second signals;
means for comparing said difference output to a reference signal;
said comparison means producing a comparison output when said reference signal exceeds said difference output; and
means for disabling the effects of said repercussion circuit comprising a switching circuit for switching the stereo audio system to a monaural function when said reference signal exceeds said difference output.

12. A method of disabling the effects of a repercussion circuit of a stereo audio system, the steps comprising:
determining a difference between first and second input signals to the repercussion circuit;
comparing said difference to a reference signal; and
disabling the effects of said first signal from the stereo audio system and coupling a second signal to the stereo audio system when said reference signal exceeds said difference.

13. The method defined in claim 12 wherein:
said first and second signals comprise analog signals; and
the method of determining the difference between said first and second signals comprises:
subtracting said first and second analog signals; and
generating a DC value corresponding to the result of subtracting said first and second analog signals.

14. The method defined in claim 12 wherein:
said first signal comprises a left audio signal from an FM demodulator; and
said second signal comprises a right audio signal from said FM demodulator.

15. The method defined in claim 12 wherein:
said first signal comprises a right audio signal from an FM demodulator; and
said second signal comprises a left audio signal from said FM demodulator.

16. The method defined in claim 12 wherein:
said stereo audio system includes a left speaker, a right speaker, and at least one repercussion speaker connected in series between said left and right speakers.

17. A circuit for use in connection with a repercussion circuit of a stereo audio system, the circuit comprising:
a detection circuit for generating an output based on detection of a stereo signal;
a switching circuit in electronic communication with said detection circuit and the stereo audio system for controlling, in response to said output from said detection circuit, a repercussion sound, output from a speaker system of said stereo audio system, by grounding at least one repercussion speaker in said speaker system when said stereo signal is not detected.

18. The circuit defined in claim 17 wherein:
said speaker system comprises a left speaker, a right speaker, and said at least one repercussion speaker connected in series between said left and right speaker.

19. The circuit defined in claim 18 wherein:
said at least one repercussion speaker comprises two repercussion speakers connected in series between said left and right speakers; and
said switching circuit grounds a midpoint connection between said two repercussion speakers.

* * * * *